United States Patent
Park et al.

(10) Patent No.: US 11,538,801 B2
(45) Date of Patent: Dec. 27, 2022

(54) SEMICONDUCTOR PACKAGE

(71) Applicant: Samsung Electronics Co., Ltd., Suwon-si (KR)

(72) Inventors: Jongho Park, Cheonan-si (KR); Seung Hwan Kim, Asan-si (KR); Jun Young Oh, Seoul (KR); Jungjoo Kim, Daegu (KR); Yongkwan Lee, Hwaseong-si (KR); Dong-Ju Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 17/220,468

(22) Filed: Apr. 1, 2021

(65) Prior Publication Data

US 2022/0068904 A1    Mar. 3, 2022

(30) Foreign Application Priority Data

Aug. 25, 2020   (KR) .................. 10-2020-0107346

(51) Int. Cl.
*H01L 25/18*      (2006.01)
*H01L 23/538*    (2006.01)
(Continued)

(52) U.S. Cl.
CPC .......... *H01L 25/18* (2013.01); *H01L 23/5383* (2013.01); *H01L 25/50* (2013.01);
(Continued)

(58) Field of Classification Search
CPC ......... H01L 2924/1205; H01L 23/5383; H01L 25/18; H01L 2224/73204; H01L 24/73; H01L 25/50; H01L 23/5385; H01L 23/5389; H01L 23/49816; H01L 2225/1058; H01L 23/5386; H01L 25/0652; H01L 25/0657; H01L 23/3107;
(Continued)

(56) References Cited

U.S. PATENT DOCUMENTS 10,529,676 B2   1/2020   Bae et al.
10,636,765 B2   4/2020   Yang et al.
(Continued)

FOREIGN PATENT DOCUMENTS

KR    101228623 B1    2/2013
KR    101550834 B1    9/2015

*Primary Examiner* — Thanh Y. Tran
(74) *Attorney, Agent, or Firm* — Harness, Dickey & Pierce, P.L.C.

(57) ABSTRACT

A semiconductor package includes a first substrate that includes a first trench on a recessed portion of a bottom surface of the first substrate and a first through hole extending through the first substrate to the first trench, a first semiconductor chip on the first substrate, a first capacitor chip in the first trench and on the first substrate, and a first molding layer on the first substrate and covering the first semiconductor chip. The first molding layer includes a first part that extends parallel to a top surface of the first substrate, a second part connected to the first part and extending vertically in the first through hole, and a third part connected to the second part and surrounding the first capacitor chip. A bottom surface of the third part is coplanar with the bottom surface of the first substrate.

20 Claims, 10 Drawing Sheets

(51) Int. Cl.
 H01L 25/00 (2006.01)
 H01L 23/00 (2006.01)
(52) U.S. Cl.
 CPC ............ *H01L 24/16* (2013.01); *H01L 24/73* (2013.01); *H01L 2224/16225* (2013.01); *H01L 2224/73204* (2013.01); *H01L 2924/1205* (2013.01); *H01L 2924/1431* (2013.01); *H01L 2924/1434* (2013.01)
(58) Field of Classification Search
 CPC ............ H01L 23/3114; H01L 23/3121; H01L 23/3135; H01L 23/3142; H01L 23/315; H01L 23/3178; H01L 23/28; H01L 21/56; H01L 21/563; H01L 21/565; H01L 33/52; H01L 33/54; H01L 33/56; H01L 24/97; H01L 2225/1041; H01L 25/043; H01L 25/0756
 See application file for complete search history.

(56) References Cited

U.S. PATENT DOCUMENTS

| | | |
|---|---|---|
| 2018/0096967 A1 | 4/2018 | Tsai et al. |
| 2018/0108619 A1 | 4/2018 | Yang |
| 2019/0115325 A1* | 4/2019 | Im .................... H01L 23/49816 |
| 2019/0363073 A1 | 11/2019 | Hong et al. |
| 2020/0152607 A1 | 5/2020 | Chiu |
| 2021/0066245 A1* | 3/2021 | Ahn .................... H01L 25/0652 |
| 2021/0183755 A1* | 6/2021 | Ong .................... H01L 21/4803 |

* cited by examiner

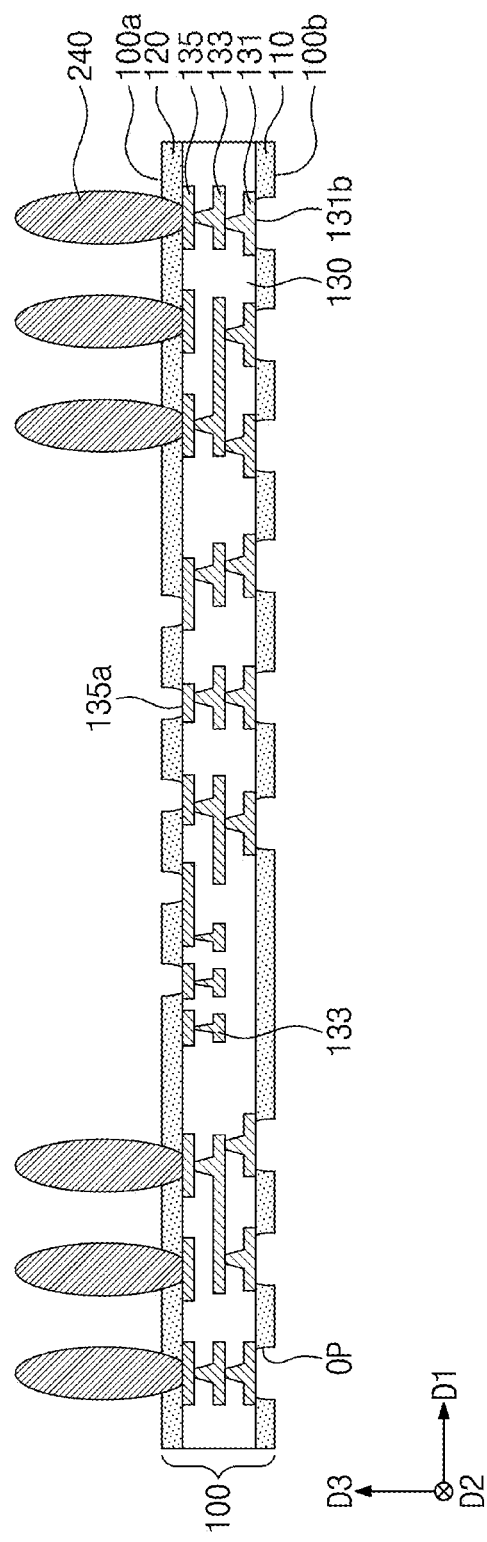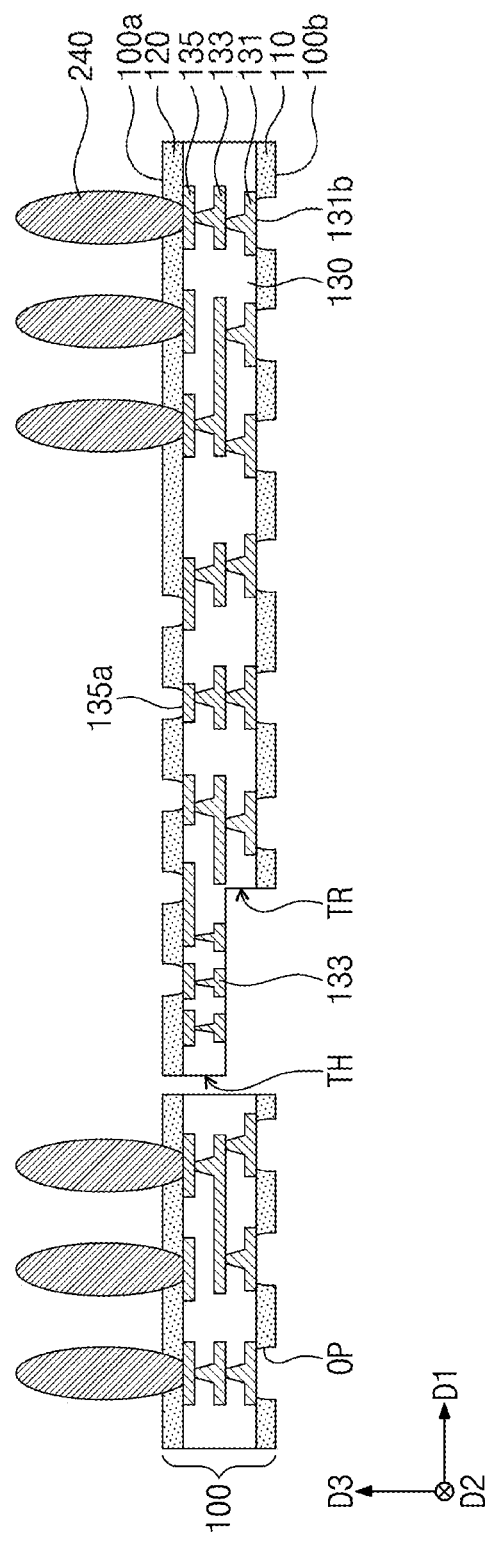

SEMICONDUCTOR PACKAGE

CROSS-REFERENCE TO RELATED APPLICATION

This U.S. nonprovisional application claims priority under 35 U.S.C. § 119 to Korean Patent Application No. 10-2020-0107346, filed on Aug. 25, 2020 in the Korean Intellectual Property Office, the disclosure of which is hereby incorporated by reference in its entirety.

BACKGROUND

Inventive concepts relate to a semiconductor package, and more particularly, to a semiconductor package including a capacitor chip.

A semiconductor package is provided to implement an integrated circuit chip to qualify for use in electronic products. Typically, a semiconductor package includes a semiconductor chip is mounted on a printed circuit board (PCB) and bonding wires or bumps are to electrically connect the semiconductor chip to the printed circuit board. With the development of electronic industry, various research has been conducted to improve reliability and durability of semiconductor packages.

SUMMARY

Some example embodiments of inventive concepts provide a semiconductor package with improved electrical characteristics and compact size.

Some example embodiments of inventive concepts provide a method of fabricating a semiconductor package in which method cuts down manufacturing cost.

Inventive concepts are not limited to the features mentioned above, and other features and effects, which have not been mentioned above, will be clearly understood to those skilled in the art from the following description.

According to some example embodiments of inventive concepts, a semiconductor package may include a first substrate including a first trench in a recessed portion of a bottom surface of the first substrate and a first through hole extending through the first substrate to the first trench; a first semiconductor chip on the first substrate; a first capacitor chip in the first trench and on the first substrate; and a first molding layer on the first substrate and covering the first semiconductor chip. The first molding layer may include a first part extending parallel to a top surface of the first substrate, a second part connected to the first part and extending vertically in the first through hole, and a third part connected to the second part and surrounding the first capacitor chip. A bottom surface of the third part may be coplanar with the bottom surface of the first substrate.

According to some example embodiments of inventive concepts, a semiconductor package may include a first substrate including a first trench in a recessed portion of a bottom surface of the first substrate and a first through hole extending through the first substrate to the first trench; a first semiconductor chip on the first substrate; a first capacitor chip in the first trench, the first capacitor chip having a first surface facing the first semiconductor chip and a second surface opposite to the first surface; and a first molding layer on the first substrate and covering the first semiconductor chip. The first molding layer may include a first part extending parallel to a top surface of the first substrate and covering the first semiconductor chip, a second part connected to the first part and extending vertically in the first through hole, and a third part connected to the second part and in the first trench. The third part of the first molding layer may cover the second surface of the first capacitor chip.

According to some example embodiments of inventive concepts, a semiconductor package may include a first substrate including a first trench in a recessed portion of a bottom surface of the first substrate and a first through hole extending through the first substrate to the first trench; a plurality of external coupling terminals on the bottom surface of the first substrate; a first semiconductor chip on the first substrate and including a plurality of first chip pads; a first capacitor chip in the first trench and on the first substrate; a first molding layer on the first substrate and covering the first semiconductor chip; a second substrate on a top surface of the first molding layer; a third substrate on the second substrate and including a plurality of conductive pads; a plurality of package connection terminals between the second substrate and the third substrate; a second semiconductor chip on the third substrate and including a plurality of second chip pads; and a plurality of bonding wires on the third substrate and connecting the plurality of conductive pads to the plurality of second chip pads. The first molding layer may include a first part extending parallel to a top surface of the first substrate; a second part connected to the first part and extending vertically in the first through hole; and a third part connected to the second part and surrounding the first capacitor chip. A bottom surface of the third part may be coplanar with the bottom surface of the first substrate.

BRIEF DESCRIPTION OF THE DRAWINGS

FIGS. 7 to 11 illustrate cross-sectional views showing a method of fabricating a semiconductor package according to some example embodiments of inventive concepts.

DETAILED DESCRIPTION

Figure 1:
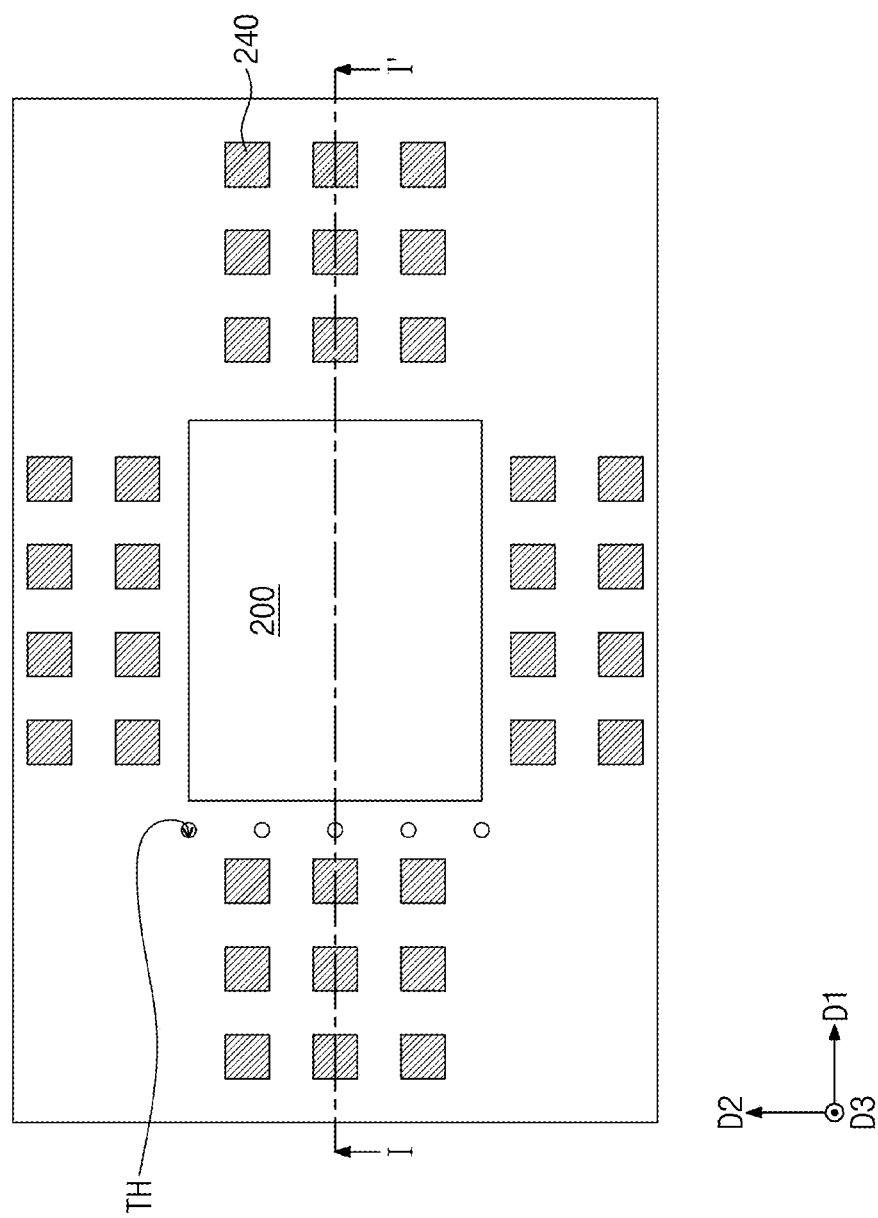
FIG. 1 illustrates a plan view showing a semiconductor package according to some example embodiments of inventive concepts.

In this description, like reference numerals may indicate like components. The following will now describe a semiconductor package and its fabrication method according to inventive concepts.

Figure 2:
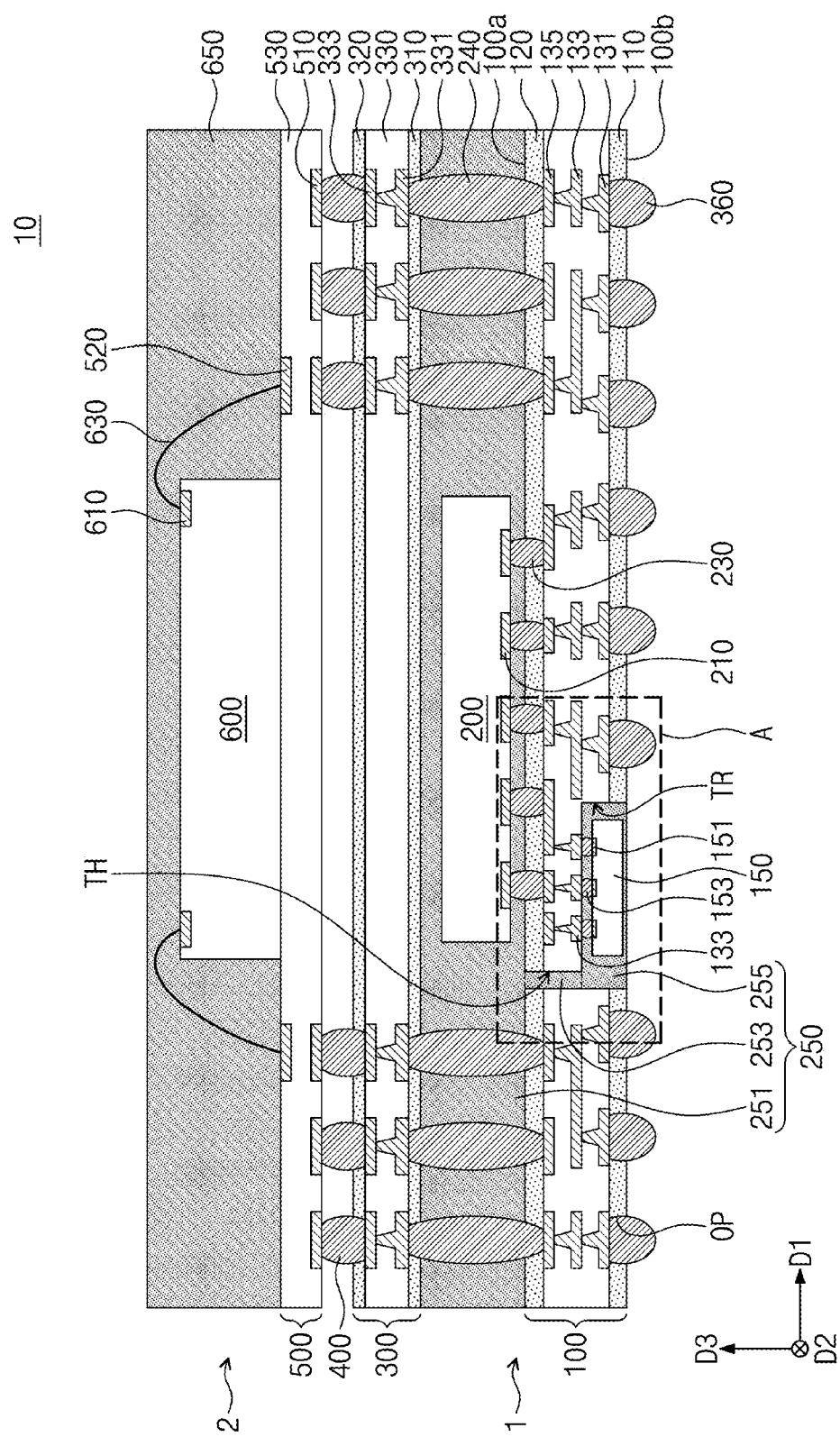
FIG. 2 illustrates a cross-sectional view taken along line I-I' of FIG. 1.
Figure 3:
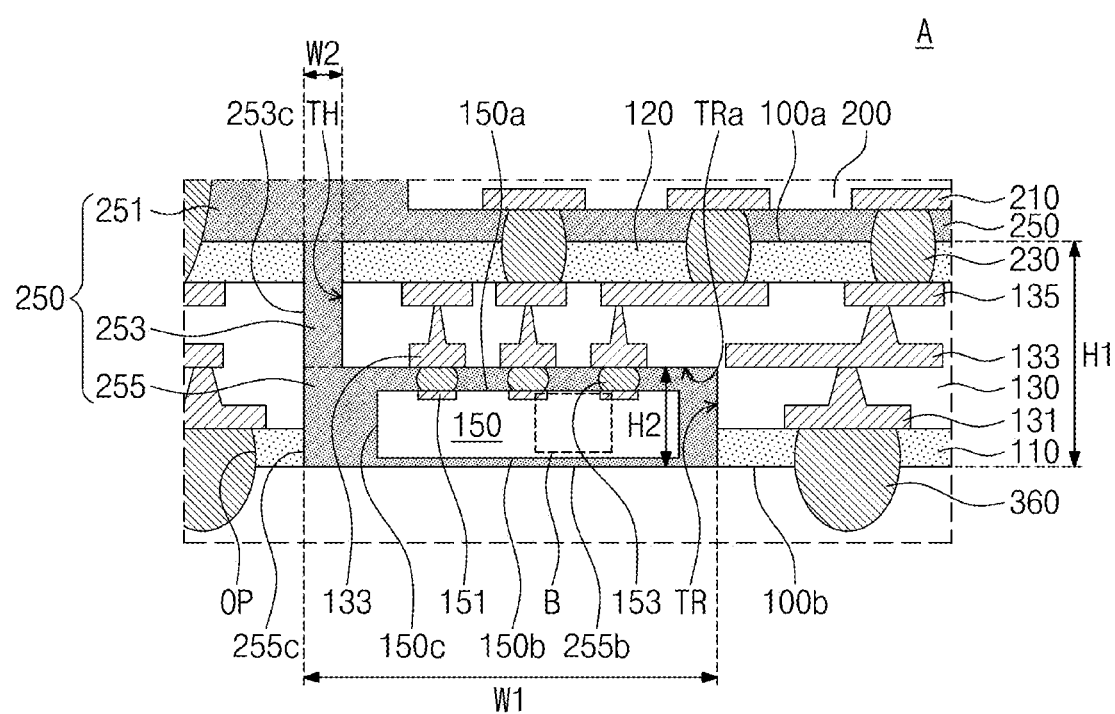
FIG. 3 illustrates an enlarged view of section A of FIG. 2.

FIG. 1 illustrates a plan view showing a semiconductor package according to some example embodiments of inventive concepts. FIG. 2 illustrates a cross-sectional view taken along line I-I' of FIG. 1. FIG. 3 illustrates an enlarged view of section A of FIG. 2.

Referring to FIGS. 1 to 3, a semiconductor package 10 according to some example embodiments of inventive concepts may include a lower semiconductor package 1 and an upper semiconductor package 2. The lower semiconductor package 1 may include a first substrate 100, a first semiconductor chip 200, a first capacitor chip 150, and a first molding layer 250, and the upper semiconductor package 2 may include a third substrate 500, a second semiconductor chip 600, bonding wires 630, and a second molding layer 650.

The first substrate 100 may be provided. The first substrate 100 may include a first lower passivation layer 110, a first upper passivation layer 120, a first core layer 130, first lower conductive patterns 131, first upper conductive patterns 132, and interconnection patterns 133. The first substrate 100 may be, for example, a printed circuit board (PCB) or a flexible substrate. However, this is merely an example without limiting inventive concepts, and the first substrate 100 may be one of a coreless printed circuit board, a coreless multi-layered printed circuit board, and a coreless flexible substrate, each of which does not include the first core layer 130. The first substrate 100 may have a height of about 100 µm to about 200 µm in a third direction D3.

The first core layer 130 may include, for example, one or both of resin and glass fiber. The first lower passivation layer 110 and the first upper passivation layer 120 may be respectively provided on a bottom surface and a top surface of the first core layer 130. The first lower passivation layer 110 may cover the bottom surface of the first core layer 130, but may not cover bottom surfaces of the first lower conductive patterns 131. For example, the first lower passivation layer 110 may include openings OP that expose the bottom surfaces of the first lower conductive patterns 131. The first upper passivation layer 120 may cover the top surface of the first core layer 130, but may not cover top surfaces of the first upper conductive patterns 135. For example, the first upper passivation layer 120 may include openings that expose the top surfaces of the first upper conductive patterns 135.

The first lower passivation layer 110 and the first upper passivation layer 120 may include a dielectric material. For example, the first lower passivation layer 110 and the first upper passivation layer 120 may include a thermosetting resin such as an epoxy resin, a thermoplastic resin such as polyimide, a photo-curable resin, or a resin impregnated with one or more of glass fiber and inorganic fillers. The first lower passivation layer 110 may have a bottom surface that corresponds to a bottom surface 100b of the first substrate 100, and the first upper passivation layer 120 may have a top surface that corresponds to a top surface 100a of the first substrate 100.

The first lower conductive patterns 131 may be provided in the first core layer 130. For example, the first lower conductive patterns 131 may be provided on a lower portion of the first core layer 130. The first lower conductive patterns 131 may each have top and lateral surfaces covered with the first core layer 130. The bottom surface of each of the first lower conductive patterns 131 may not be covered with the first core layer 130. Therefore, the bottom surface of each of the first lower conductive patterns 131 may be exposed to the outside. The first lower conductive patterns 131 may define positions where external coupling terminals 360 are disposed. The first lower conductive patterns 131 may serve as pads for the external coupling terminals 360. The first lower conductive patterns 131 may include a metallic material. For example, the first lower conductive patterns 131 may include one or more of copper, tungsten, and titanium. The first lower conductive patterns 131 may be disposed spaced apart from each other in a first direction D1.

In this description, the first direction D1 may be parallel to the bottom surface 100b of the first substrate 100. A second direction D2 may be parallel to the bottom surface 100b of the first substrate 100, while intersecting the first direction D1. The third direction D3 may intersect both of the first and second directions D1 and D2.

The interconnection patterns 133 may be provided in the first core layer 130. The interconnection patterns 133 may be correspondingly provided on the first lower conductive patterns 131. The interconnection patterns 133 may be in contact with and electrically connected to the first lower conductive patterns 131. The interconnection patterns 133 may each include a line part and a via part provided on the line part. The via part may be connected to the line part, and may extend from the line part toward the top surface 100a of the first substrate 100. However, differently from that shown, the line part may be provided on the via part, and the configuration of the line and via parts may be variously changed without being limited thereto. The interconnection patterns 133 may include a metallic material, such as one or more of copper, tungsten, and titanium.

The first upper conductive patterns 135 may be provided in the first core layer 130. The first upper conductive patterns 135 may be provided on an upper portion of the first core layer 130. The first upper conductive patterns 135 may each have bottom and lateral surfaces covered with the first core layer 130. The top surface of each of the first upper conductive patterns 132 may not be covered with the first core layer 130. Therefore, the top surface of each of the first upper conductive patterns 135 may be exposed to the outside. The first upper conductive patterns 135 may define positions where conductive structures 240 are disposed. The first upper conductive patterns 135 may serve as pads for the conductive structures 240. The first upper conductive patterns 135 may be in contact with and electrically connected to the interconnection patterns 133. The first upper conductive patterns 135 may include a metallic material. For example, the first upper conductive patterns 135 may include one or more of copper, tungsten, and titanium. The first upper conductive patterns 135 may be disposed spaced apart from each other in the first direction D1.

The first lower conductive patterns 131 may be provided on their bottom surfaces with the external coupling terminals 360 coupled to the interconnection patterns 133. The external coupling terminals 360 may fill the openings OP of the first lower passivation layer 110. External electrical signals may be transferred through the external coupling terminals 360 to the interconnection patterns 133. Solder balls may be used as the external coupling terminals 360. The external coupling terminal 360 may include metal, such as a solder material.

The first substrate 100 may include a first trench TR on a recessed portion of the bottom surface 100b thereof. The first trench TR may have a width W1 of about 300 µm to about 400 µm in the first direction D1. The first trench TR may have a height H2 of about 10 µm to about 100 µm in the third direction D3. A value of about 0.1 to about 0.5 may be given as a ratio of the height H2 of the first trench TR to a height H1 in the third direction D3 of the first substrate 100. The first substrate 100 may include a first through hole TH that penetrates therethrough. The first through hole TH may have a width W2 of about 100 µm to about 300 µm in the first direction D1. When viewed in plan, at least a portion of the first trench TR may overlap the first semiconductor chip 200. When viewed in plan, the first through hole TH may not overlap the first semiconductor chip 200. For example, when viewed in plan, the first through hole TH may be disposed between the first semiconductor chip 200 and the conductive structures 240. The first through hole TH may be spatially connected to the first trench TR. The first through hole TH may be provided on the first trench TR. The first through hole TH and the first trench TR1 may vertically overlap each other. The first through hole TH may have an inner sidewall that is vertically aligned with that of the first trench TR. The first trench TR may expose bottom surfaces of some of the interconnection patterns 133. The exposed bottom surfaces of the interconnection patterns 133 may define positions where capacitor connection terminals 153 are disposed.

The first semiconductor chip 200 may be mounted on the first substrate 100. The first semiconductor chip 200 may be disposed on a central region of the first substrate 100. When viewed in plan, the first semiconductor chip 200 may overlap at least a portion of the first trench TR. When viewed in plan, the first semiconductor chip 200 may not overlap the first through hole TH. The first semiconductor chip 200 may include first chip pads 210. The first chip pads 210 may include a metallic material, such as copper, tungsten, titanium, or any alloy thereof. The first chip pads 210 may be exposed on a bottom surface of the first semiconductor chip 200. The first chip pads 210 may connect the first semiconductor chip 200 to the first substrate 100. The first semiconductor chip 200 may include integrated circuits therein. The integrated circuits may be disposed adjacent to the bottom surface of the first semiconductor chip 200. The integrated circuits may include a memory circuit, a logic circuit, or a combination thereof. The first chip pads 210 may be electrically connected to the integrated circuits. Chip connection terminals 230 may be correspondingly interposed between the first chip pads 210 and the first upper conductive patterns 135. The chip connection terminals 230 may include one or more of solders, pillars, and bumps. The chip connection terminals 230 may include a conductive material, such as a solder material. The solder material may include, for example, tin, bismuth, lead, silver, or any alloy thereof. The first semiconductor chip 200 may be electrically connected through the chip connection terminals 230 to the first substrate 100. In this description, the language "connected" may include "physically connected", "directly electrically connected", or "indirectly electrically connected."

The first capacitor chip 150 may be mounted on the first substrate 100. The first capacitor chip 150 may have a first surface 150a directed toward the first semiconductor chip 200 and a second surface 150b opposite to the first surface 150a. The first capacitor chip 150 may include capacitor chip pads 151. The capacitor chip pads 151 may be exposed on the first surface 150a of the first capacitor chip 150. The capacitor chip pads 151 may include a metallic material, such as copper, tungsten, titanium, or any alloy thereof. According to some example embodiments, the capacitor connection terminals 153 may be correspondingly interposed between the capacitor chip pads 151 and the interconnection patterns 133. The first capacitor chip 150 may be electrically connected to the first semiconductor chip 200 through the capacitor connection terminals 153 and the first substrate 100. The first capacitor chip 150 will be further discussed below with reference to FIGS. 3 to 5.

The first molding layer 250 may be provided on the first substrate 100. The first molding layer 250 may include a dielectric material. For example, the first molding layer 250 may include an epoxy-based polymer. The first molding layer 250 may cover the top surface 100a of the first substrate 100 and may surround the first semiconductor chip 200. The first molding layer 250 may vertically extend to fill the first through hole TH and the first trench TR. The first molding layer 250 may include a first part 251 provided on the top surface 100a of the first substrate 100, a second part 253 provided in the first through hole TH, a third part 255 provided in the first trench TR. The first part 251, the second part 253, and the third part 255 may be connected to each other to constitute the first molding layer 250. The second part 253 may be provided between the first part 251 and the third part 255. The first molding layer 250 will be further discussed in detail below with reference to FIG. 3.

The conductive structures 240 may be provided on the first substrate 100. The conductive structures 240 may be correspondingly provided between the first upper conductive patterns 135 and second lower conductive patterns 331 which will be discussed below. When viewed in plan, the conductive structures 240 may be disposed on an edge region of the first substrate 100. The conductive structures 240 may be disposed spaced apart in the first direction D1 from the first semiconductor chip 200. The conductive structures 240 may be disposed spaced apart from each other in the first direction D1 or the second direction D2. The conductive structures 240 may penetrate the first molding layer 250 and may connect the first substrate 100 to a second substrate 300 which will be discussed below. The conductive structures 240 may include a metallic material, such as one or more of copper, tungsten, and titanium. The conductive structures 240 may include one or more of solders, pillars, and bumps. The conductive structures may include a conductive material, such as a solder material.

According to some example embodiments of inventive concepts, the semiconductor package 10 may further include a second substrate 300 provided on the first molding layer 250. The second substrate 300 may include a second lower passivation layer 310, a second upper passivation layer 320, a second core layer 330, second lower conductive patterns 331, and second upper conductive patterns 333.

The second substrate 300 may be, for example, a single-layered or multi-layered printed circuit board (PCB) or a single-layered or multi-layered flexible substrate. However, this is merely an example without limiting inventive concepts, and the second substrate 300 may be one of a coreless printed circuit board and a coreless flexible substrate, each of which does not include the second core layer 330.

The second core layer 330 may include the same material as the first core layer 130. The second lower passivation layer 310 and the second upper passivation layer 320 may be respectively provided on a bottom surface and a top surface of the second core layer 330. The second lower passivation layer 310 and the second upper passivation layer 320 may include the same material as that of the first lower passivation layer 110 and the first upper passivation layer 120. The second lower passivation layer 310 may include openings that expose bottom surfaces of the second lower conductive patterns 331, and the second upper passivation layer 320 may include openings that expose top surfaces of the second upper conductive patterns 333. The exposed bottom surfaces of the second lower conductive patterns 331 may define positions where the conductive structures 240 are disposed, and the exposed top surfaces of the second upper conductive patterns 333 may define positions where package connection terminals 400 are disposed.

The semiconductor package 10 according to some example embodiments of inventive concepts may include the upper semiconductor package 2 provided on the lower semiconductor package 1. The upper semiconductor package 2 may include a third substrate 500, a second semiconductor chip 600, bonding wires 630, and a second molding layer 650.

The third substrate 500 may include one or more of a silicon substrate, a germanium substrate, a silicon-germanium substrate, and a single-layered or multi-layered printed circuit board, but inventive concepts are not limited thereto. The third substrate 500 may include a third core layer 530, third lower conductive patterns 510, and third upper conductive patterns 520. The third core layer 530 may include the same material as that of the first and second core layers 130 and 330. The third core layer 530 may cover top and lateral surfaces of the third lower conductive patterns 510, but may not cover bottom surfaces of the third lower conductive patterns 510. Therefore, the bottom surfaces of the third lower conductive patterns 510 may be exposed to the outside. The third lower conductive patterns 510 may serve as pads for the package connection terminals 400. The third lower conductive patterns 510 may be referred to as conductive pads 510. The third core layer 530 may cover bottom and lateral surfaces of the third upper conductive patterns 520, but may not cover top surfaces of the third upper conductive patterns 520. Therefore, the top surfaces of the third upper conductive patterns 520 may be exposed to the outside. The third upper and lower conductive patterns 520 and 510 may include a metallic material, such as one or more of copper, tungsten, and titanium. The third core layer 530 may be provided therein with interconnection lines (not shown) that connect the third upper conductive patterns 520 to the third lower conductive patterns 510. The interconnection lines (not shown) may include a metallic material.

The package connection terminals 400 may be correspondingly interposed between the third lower conductive patterns 510 of the third substrate 500 and the second upper conductive patterns 333 of the second substrate 300. Solder balls may be used as the package connection terminals 400. The package connection terminals 400 may include metal, such as a solder material. The package connection terminals 400 may electrically connect the second substrate 300 to the third substrate 500.

The second semiconductor chip 600 may be provided on the third substrate 500. The second semiconductor chip 600 may include second chip pads 610. The second chip pads 610 may include a metallic material, such as copper, tungsten, titanium, or any alloy thereof. The second chip pads 610 may be exposed on a top surface of the second semiconductor chip 600. The second chip pads 610 may connect the second semiconductor chip 600 to the third substrate 500. The second semiconductor chip 600 may include integrated circuits therein. The integrated circuits may be disposed adjacent to the top surface of the second semiconductor chip 600. The integrated circuits may include a memory circuit, a logic circuit, or a combination thereof. The second chip pads 610 may be electrically connected to the integrated circuits.

The bonding wires 630 may be correspondingly provided between the second chip pads 610 and the third upper conductive patterns 520. The bonding wires 630 may have a curved line shape. The bonding wires 630 may include a metallic material, such as gold, silver, platinum, lead, copper, tungsten, aluminum, titanium, or any alloy thereof. The bonding wires 630 may electrically connect the second semiconductor chip 600 to the third substrate 500.

The second molding layer 650 may be provided on a top surface of the third substrate 500. The second molding layer 650 may include a dielectric material. The second molding layer 650 may include, for example, an epoxy-based polymer. The second molding layer 650 may cover lateral and top surfaces of the second semiconductor chip 600. The second molding layer 650 may encapsulate the bonding wires 630. The second molding layer 650 and the third substrate 500 may have their lateral surfaces that are vertically aligned with each other.

Figure 4:
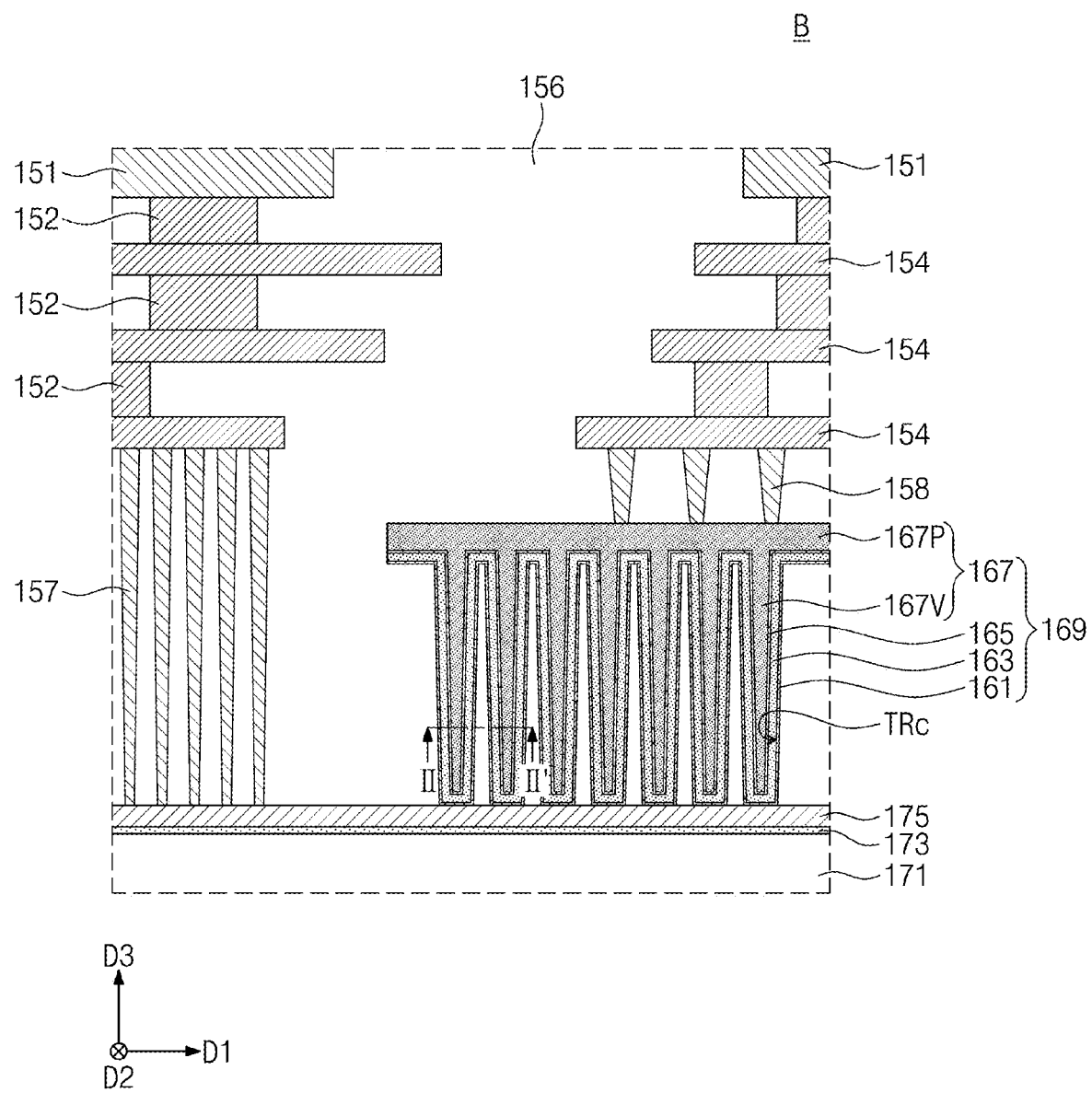
FIG. 4 illustrates an enlarged view of section B of FIG. 3, showing a capacitor chip according to some example embodiments of inventive concepts.
Figure 5:
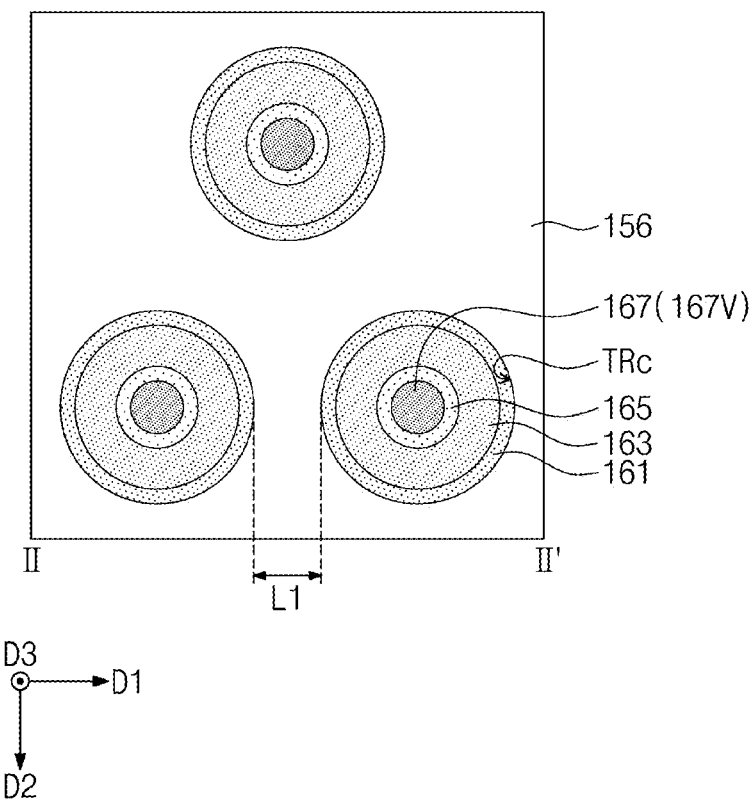
FIG. 5 illustrates a plan view taken along line II-II' of FIG. 4.

FIG. 3 illustrates an enlarged view of section A of FIG. 2. FIG. 4 illustrates an enlarged view of section B of FIG. 3, showing a capacitor chip according to some example embodiments of inventive concepts. FIG. 5 illustrates a plan view taken along line II-IF of FIG. 4. The following description will refer to FIGS. 3 to 5 together with FIG. 2.

Referring FIGS. 2 and 3, the first molding layer 250 may include the first part 251, the second part 253, and the third part 255.

The first part 251 of the first molding layer 250 may be provided on the top surface 100*a* of the first substrate 100. The first part 251 may cover lateral and top surfaces of the first semiconductor chip 200 and may encapsulate the chip connection terminals 230. Of the first molding layer 250, the first part 251 may be a segment located at a higher level than that of the top surface 100*a* of the first substrate 100. The first part 251 may extend in a direction parallel to the top surface 100*a*.

The second part 253 of the first molding layer 250 may penetrate an upper portion of the first substrate 100. The second part 253 may be provided in the first through hole TH and may extend vertically. The second part 253 may fill the first through hole TH and may contact the inner sidewall of the first through hole TH. For example, the second part 253 may contact the first lower passivation layer 110, the first upper passivation layer 120, and the first core layer 130 exposed to the first through hole TH. The second part 253 may have one end connected to the first part 251 and other end connected to the third part 255. Of the first molding layer 250, the second part 253 may be a segment at a level between that of a top surface TRa of the first trench TR and that of the top surface 100*a* of the first substrate 100. The second part 253 may have a cylindrical shape, but no limitation is imposed on the shape of the second part 253.

The third part 255 of the first molding layer 250 may be provided in the first trench TR. Of the first molding layer 250, the third part 255 may be a segment at a level between that of the top surface TRa of the first trench TR and that of the bottom surface 100*b* of the first substrate 100. The third part 255 may contact the first lower passivation layer 110 and the first core layer 130 exposed to the first trench TR. The third part 255 may contact a first surface 150*a*, lateral surfaces 150*c*, and a second surface 150*b* of the first capacitor chip 150. The third part 255 may encapsulate the capacitor connection terminals 153. The third part 255 may be connected to the second part 253.

When viewed in plan, the second part 253 of the first molding layer 250 may be provided between the first semiconductor chip 200 and the conductive structures 240. Therefore, the second part 253 may not vertically overlap the first semiconductor chip 200. At least a portion of the third part 255 of the first molding layer 250 may overlap the first semiconductor chip 200, when viewed in plan. The second part 253 may have one lateral surface 253*c* vertically aligned with one lateral surface 255*c* of the third part 255. For example, the one lateral surface 253*c* of the second part 253 may be coplanar with the one lateral surface 255*c* of the third part 255.

The third part 255 may have a bottom surface 255*b* at the same level as that of the bottom surface 100*b* of the first substrate 100. For example, the bottom surface 255*b* of the third part 255 may be coplanar with the bottom surface 100*b* of the first substrate 100. For another example, differently from that shown, the bottom surface 255*b* of the third part 255 may be located at a level between that of the bottom surface 100*b* of the first substrate 100 and that of the second surface 150*b* of the first capacitor chip 150.

Referring to FIG. 4, according to some example embodiments of inventive concepts, the first capacitor chip 150 may include a capacitor substrate 171, a common dielectric layer 173, a first conductive layer 175, a capacitor dielectric layer 156, a capacitance structure 169, contacts 157 and 158, interconnection lines 154, vias 152, and capacitor chip pads 151.

The capacitor substrate 171 may be provided. The capacitor substrate 171 may include, for example, a silicon substrate. The common dielectric layer 173 may be provided on a top surface of the capacitor substrate 171. The common dielectric layer 173 may include a dielectric material, such as one or more of silicon oxide, silicon nitride, and silicon oxynitride. The common dielectric layer 173 may include a single layer or a plurality of layers. The first conductive layer 175 may be provided on the common dielectric layer 173. The first conductive layer 175 may include a metallic material, such as one or more of copper, tungsten, and titanium.

The first conductive layer 175 may be provided thereon with the capacitor dielectric layer 156 that has a plurality of through holes TRc on a lower portion of the capacitor dielectric layer 156. The capacitor dielectric layer 156 may include a dielectric material, such as one or more of silicon oxide, silicon nitride, and silicon oxynitride.

The capacitance structure 169 may be provided in the capacitor dielectric layer 156. The capacitance structure 169 may be provided on the first conductive layer 175, and the capacitor dielectric layer 156 may surround the capacitance structure 169. The capacitance structure 169 may include first, second, third, and fourth layers 161, 163, 165, and 167 that fill the through holes TRc of the capacitor dielectric layer 156. When viewed in plan, as shown in FIG. 5, a spacing distance L1 between the through holes TRc may range from about 100 nm to about 200 nm. The first, second, and third layers 161, 163, and 165 may be sequentially provided on inner sidewalls of the through holes TRc. The first, second, and third layers 161, 163, and 165 may conformally cover the inner sidewalls of the through holes TRc. The fourth layer 167 may be provided on the third layer 165. The fourth layer 167 may fill remaining portions of the through holes TRc. Therefore, when viewed in plan as shown in FIG. 5, the first, second, third, and fourth layers 161, 163, 165, and 167 may each have a circular or annular shape. The fourth layer 167 may include via parts 167V that extend into the through holes TRc and a horizontal part 167P that is provided on the via parts 167V. The via parts 167V may be connected to the horizontal part 167P. The first, second, third, and fourth layers 161, 163, 165, and 167 may include, for example, one or both of titanium nitride and silicon-germanium. The capacitance structure 169 may be a segment in which charges are substantially accumulated in the first capacitor chip 150.

First contacts 158 may be provided on the capacitance structure 169, and second contacts 157 may be provided on the first conductive layer 175. The vias 152 and the interconnection lines 154 may be provided on the first contacts 158 and the second contacts 157. The vias 152 and the interconnection lines 154 may electrically connect the first and second contacts 158 and 157 to the capacitor chip pads 151. The first contacts 158, the second contacts 157, the vias 152, and the interconnection lines 154 may include a metallic material, such as one or more of copper, titanium, and tungsten.

Figure 6:
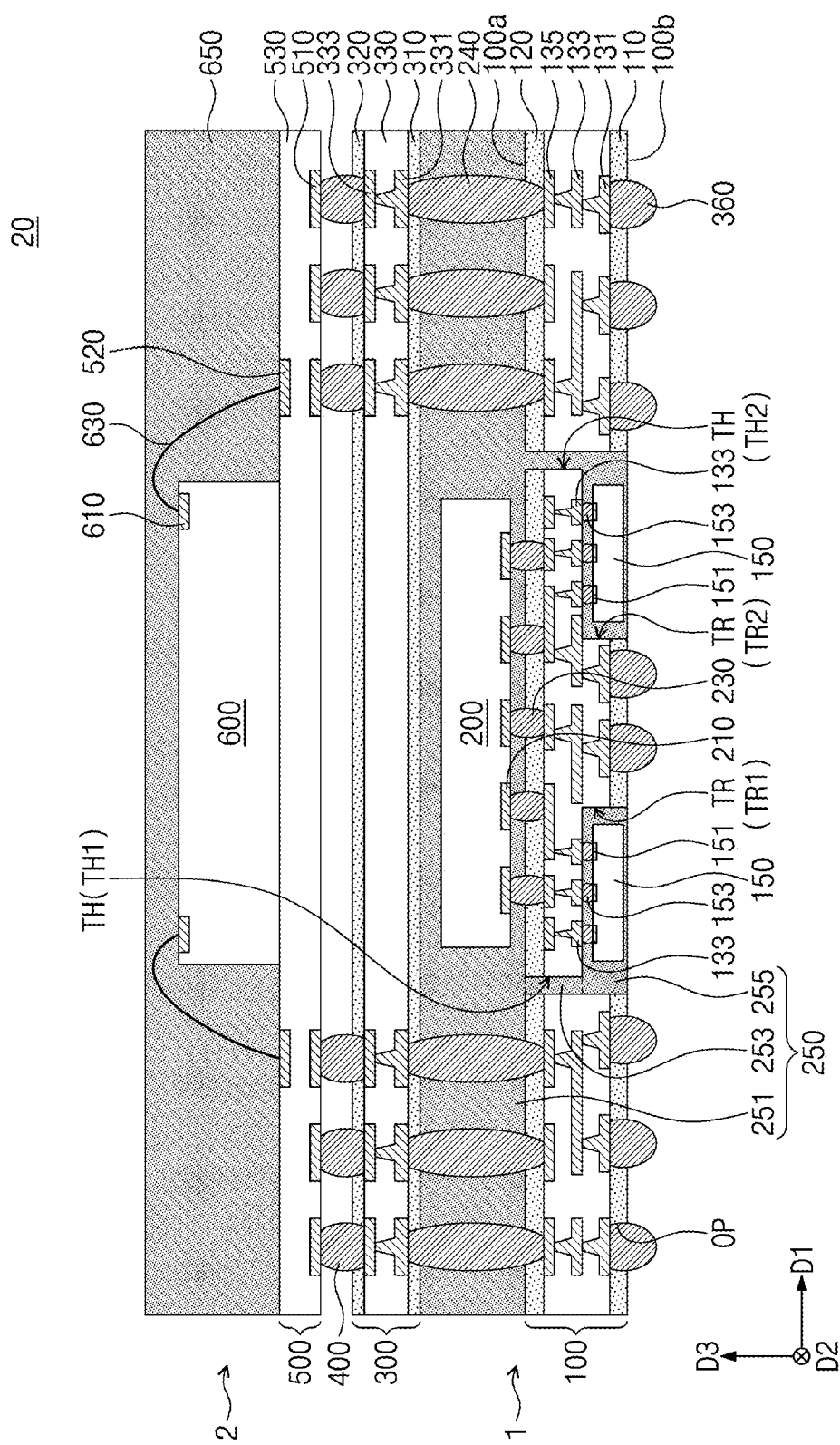
FIG. 6 illustrates a plan view showing a semiconductor package according to some example embodiments of inventive concepts.

FIG. 6 illustrates a plan view showing a semiconductor package according to some example embodiments of inventive concepts.

Referring to FIG. 6, a semiconductor package 20 according to some example embodiments of inventive concepts may include a lower semiconductor package 1 and an upper semiconductor package 2. The lower semiconductor package 1 may include a first substrate 100, a first semiconductor chip 200, a plurality of first capacitor chips 150, and a first molding layer 250. The first semiconductor chip 200 and the first capacitor chips 150 may be substantially the same as those discussed with reference to FIGS. 1 to 5. The upper semiconductor package 2 may be substantially the same as that discussed with reference to FIGS. 1 and 2. In that embodiment that follows, a repetitive description will be omitted, and a difference will be discussed in detail.

The first substrate 100 may include trenches TR on a recessed portion of the bottom surface 100b thereof. The trenches TR may include first trenches TR1 and second trenches TR2. When viewed in plan, the first trenches TR1 and the second trenches TR2 may overlap the first semiconductor chip 200. The first substrate 100 may include through holes TH that penetrate therethrough. The through holes TH may include first through holes TH1 that are spatially connected to the first trenches TR1, and may also include second through holes TH2 that are spatially connected to the second trenches TR2. When viewed in plan, the first trenches TR1 and the second trenches TR2 may be disposed between the first semiconductor chip 200 and the conductive structures 240. For example, the first through holes TH1 and the first trenches TR1 may be disposed adjacent to one lateral surface of the first semiconductor chip 200, and the second through holes TH2 and the second trenches TR2 may be disposed adjacent to other lateral surface, opposite to the one lateral surface, of the first semiconductor chip 200.

The first molding layer 250 may include a first part 251 provided on the top surface 100a of the first substrate 100, second parts 253 that fill the first and second through holes TH1 and TH2, and third parts 255 that fill the first and second trenches TR1 and TR2. Each of the second parts 253 may have one end connected to the first part 251 and other end connected to the third part 255. For example, the second parts 253 may be disposed spaced apart from each other in the first direction D1 or the second direction D2. The third parts 255 may surround the first capacitor chips 150. The first capacitor chips 150 may be provided in the first trenches TR1 and the second trenches TR2. At least a portion of the first capacitor chip 150 may vertically overlap the first semiconductor chip 200.

[Fabrication Method]

FIGS. 7 to 11 illustrate diagrams showing a method of fabricating a semiconductor package according to some example embodiments of inventive concepts.

Referring to FIG. 7, a first substrate 100 may be prepared. The first substrate 100 may be, for example, a printed circuit board (PCB). The first substrate 100 may include a first lower passivation layer 110 having openings OP that expose bottom surfaces 131b of first lower conductive patterns 131. The first substrate 100 may include a first upper passivation layer 120 having openings that expose top surfaces 135a of first upper conductive patterns 135. Conductive structures 240 may be formed on corresponding first upper conductive patterns 135 on an outer region of the first substrate 100.

Referring to FIG. 8, a first trench TR1 may be formed in a recessed portion of a bottom surface 100b of the first substrate 100, and a first through hole TH may be formed which is spatially connected to the first trench TR. The formation of the first trench TR and the first through hole TH may include removing a lower portion of the first substrate 100 to thereby form the first trench TR1, and forming the first through hole TH on an outer region of the first trench TR1. The formation of the first trench TR and the first through hole TH may include, for example, irradiating a laser on the bottom surface 100b of the first substrate 100. Alternatively, the formation of the first trench TR and the first through hole TH may include allowing the first substrate 100 to undergo one or both of wet and dry etching processes. The formation of the first trench TR and the first through hole TH is not limited to that discussed above, and the first trench TR and the first through holes TH may be formed by partially removing the first substrate 100 or by various methods. The first trench TR may expose bottom surfaces of ones of interconnection patterns 133. The exposed bottom surfaces of the interconnection patterns 133 may define a position on which a first capacitor chip (see 150 of FIG. 10) is subsequently mounted.

Figure 9:
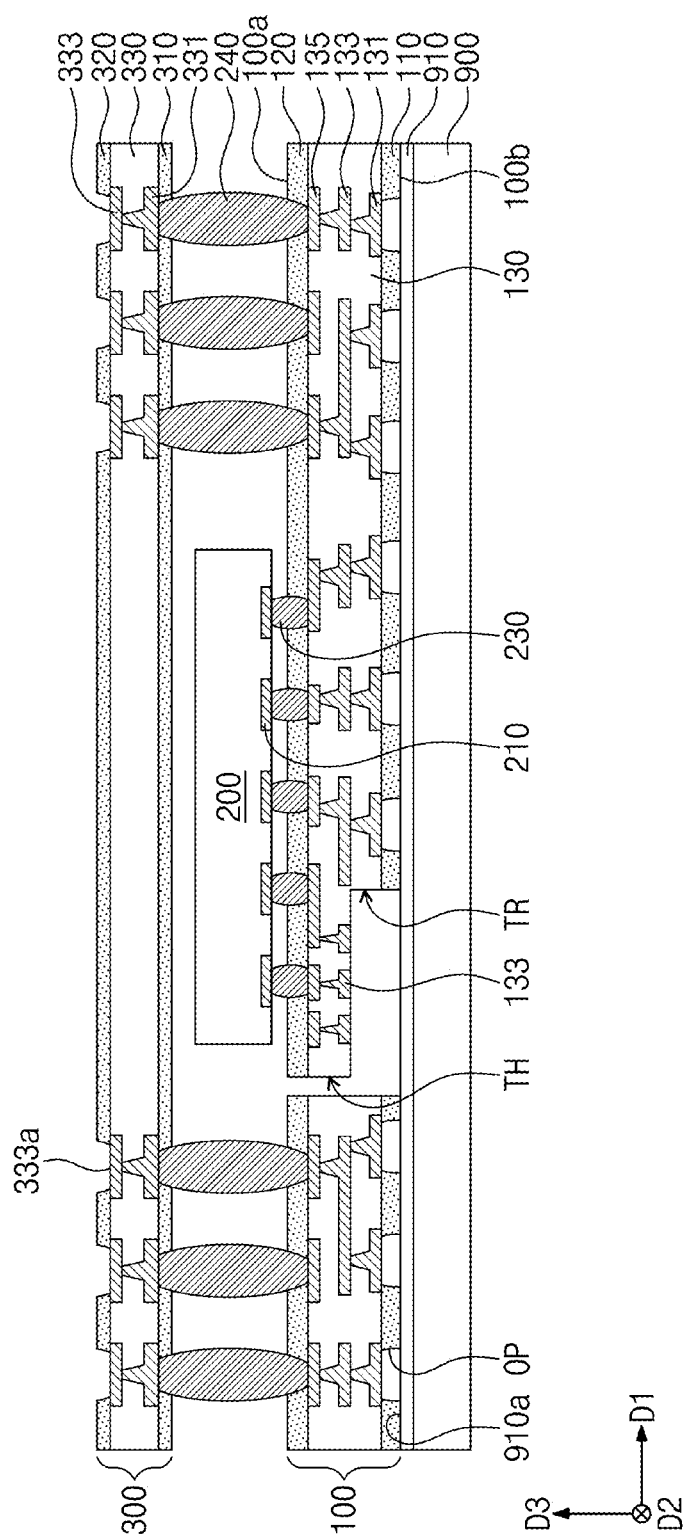

Referring to FIG. 9, a first semiconductor chip 200 may be mounted on the first substrate 100. When the first semiconductor chip 200 is mounted, first chip pads 210 may be aligned to face a top surface 100a of the first substrate 100. Chip connection terminals 230 may fix the first semiconductor chip 200 to the first substrate 100.

A second substrate 300 may be prepared. The second substrate 300 may be, for example, a printed circuit board (PCB). The second substrate 300 may be provided on the conductive structures 240. In this step, second lower conductive patterns 331 of the second substrate 300 may be vertically aligned with the conductive structures 240. The first substrate 100 and the second substrate 300 may undergo a reflow process to allow the conductive structures 240 to fix the first substrate 100 and the second substrate 300 to each other.

Figure 10:
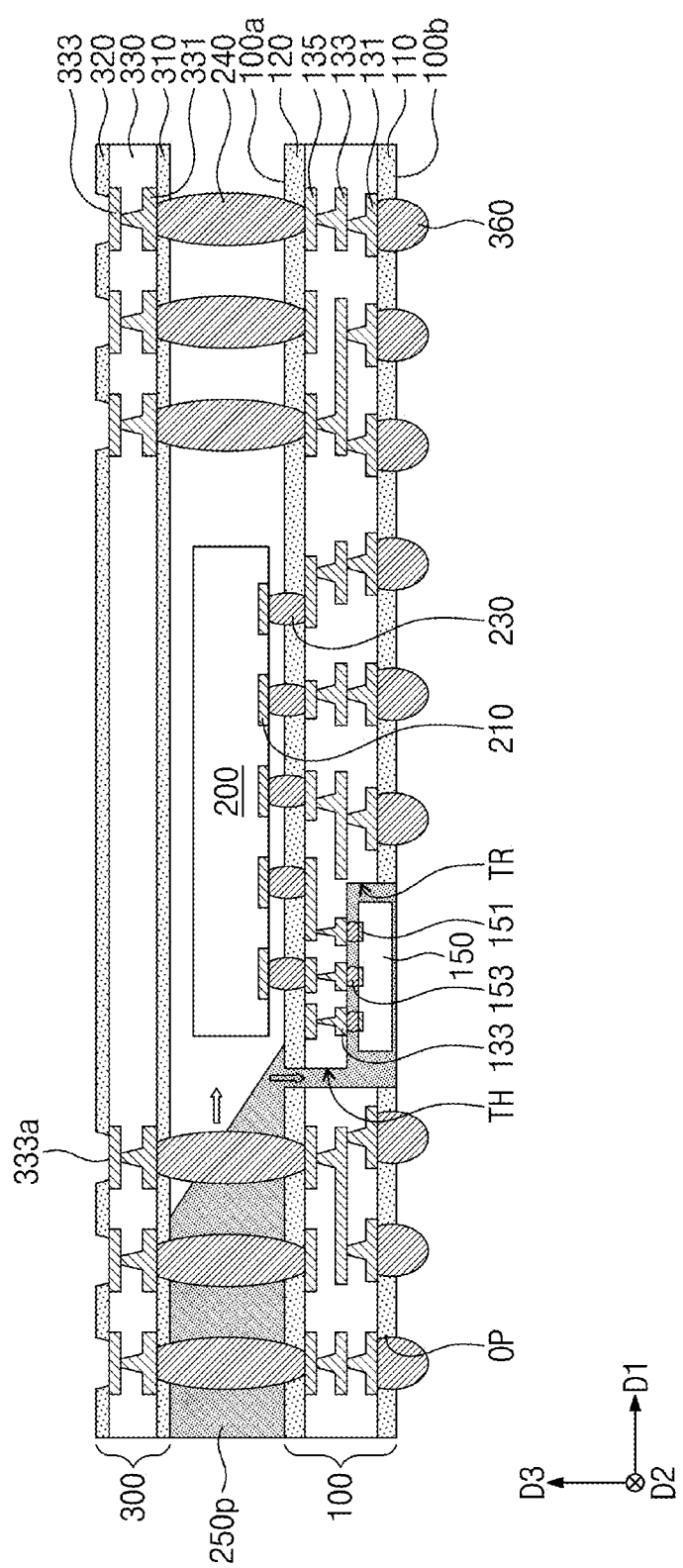
Figure 11:
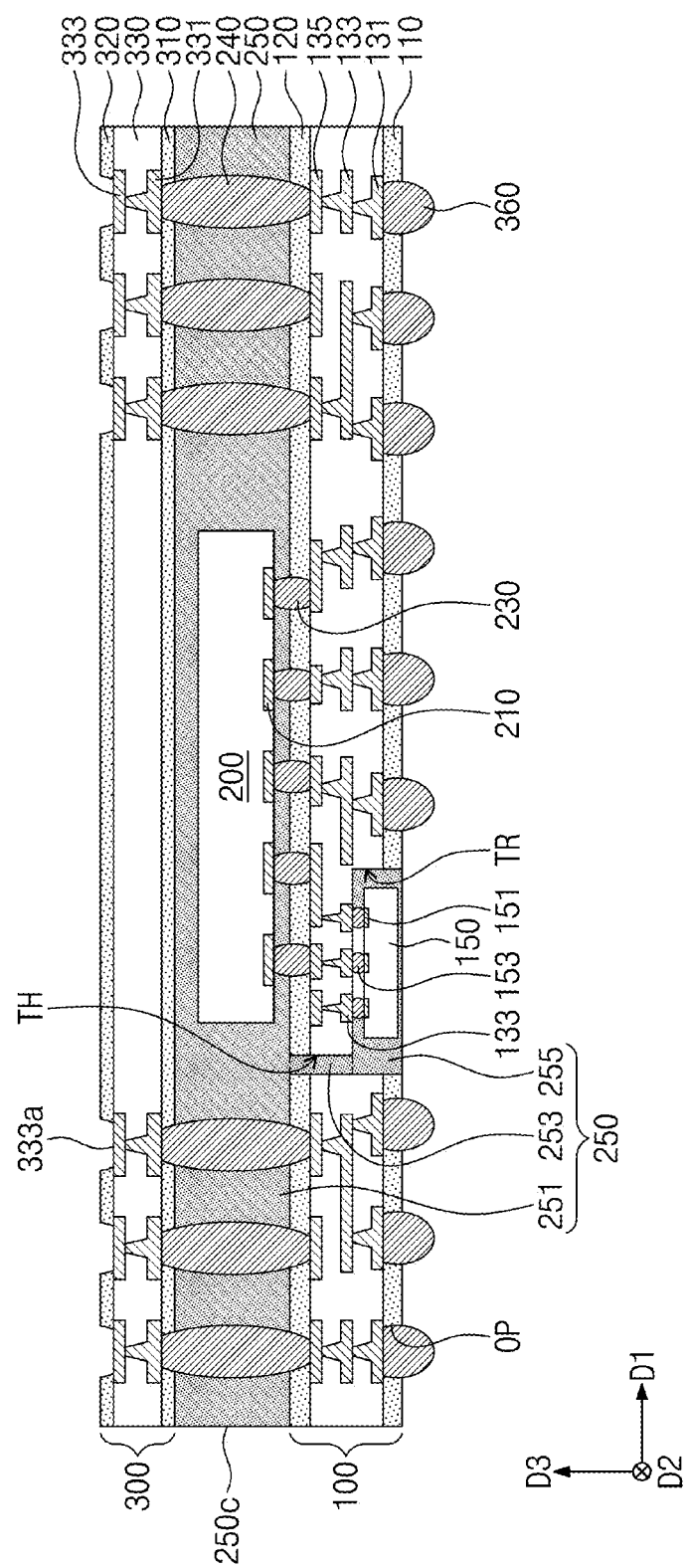

Referring to FIGS. 10 and 11, the first substrate 100 and the second substrate 300 may be provided therebetween with a first molding resin 250p that is introduced parallel to a first direction D1. The first molding resin 250p may include an epoxy-based polymer. The first molding resin 250p may have fluidity. Therefore, the first molding resin 250p may flow along the top surface 100a of the first substrate 100 and into the first through hole TH. The first molding resin 250p may surround the first semiconductor chip 200 and the conductive structures 240 on the top surface 100a of the first substrate 100. The first molding resin 250p may flow along the first through hole TH and may enter the first trench TR. Thus, the first molding resin 250p may surround a first capacitor chip 150 provided in the first trench TR, and may fill the first through hole TH. Afterwards, the first molding resin 250p may be cured to form a first molding layer 250.

Referring back to FIG. 2, an upper semiconductor package 2 may be prepared. The preparation of the upper semiconductor package 2 may include preparing a third substrate 500, providing a second semiconductor chip 600 on the third substrate 500, allowing bonding wires 630 to connect second chip pads 610 of the second semiconductor chip 600 to third upper conductive patterns 520 of the third substrate 500, forming a second molding layer 650 on a top surface of the third substrate 500, and forming package connection terminals 400 on bottom surfaces of third lower conductive patterns 510 of the third substrate 500. The upper semiconductor package 2 may be provided on a top surface of the second substrate 300. In this step, the upper semiconductor package 2 may be disposed to vertically align the package connection terminals 400 with corresponding second upper conductive patterns 333 of the second substrate 300. The package connection terminals 400 may undergo a reflow process to fix the lower and upper semiconductor packages 1 and 2 to each other. The processes mentioned above may fabricate semiconductor packages according to some example embodiments of inventive concepts.

When a power or input signal is applied through an external coupling terminal to a semiconductor chip mounted in a semiconductor package, the removal of signal noise may increase operating reliability of semiconductor packages. In the semiconductor package 10 according to some example embodiments of inventive concepts, the first trench TR may be formed in the first substrate 100 and the first capacitor chip 150 may be disposed in the first trench TR, with the result that a space may be effectively used. Accordingly, it may be possible to provide semiconductor packages with small thicknesses.

According to the method of fabricating the first molding layer 250 in accordance with some example embodiments of inventive concepts, the first molding resin 250p may be introduced through the first through hole TH into the first trench TR to thereby form the first molding layer 250 that protects both of the first semiconductor chip 200 and the first capacitor chip 150. Accordingly, a separate under-fill process may not be required to insulate and protect the first capacitor chip 150, which may result in a reduction in process step and a decrease in manufacturing cost.

According to inventive concepts, a first capacitor chip may be disposed in a first trench of a first substrate. It may thus be possible to effectively remove noise of power or input signals and to provide a compact-sized semiconductor package.

While some example embodiments of inventive concepts have been particularly shown and described, it will be understood by one of ordinary skill in the art that variations in form and detail may be made therein without departing from the spirit and scope of inventive concepts in the attached claims.

What is claimed is:
1. A semiconductor package, comprising:
a first substrate including a first trench in a recessed portion of a bottom surface of the first substrate and a first through hole extending through the first substrate to the first trench;
a first semiconductor chip on the first substrate;
a first capacitor chip in the first trench and on the first substrate; and
a first molding layer on the first substrate and covering the first semiconductor chip, wherein
the first molding layer includes a first part that extending parallel to a top surface of the first substrate, a second part connected to the first part and extending vertically in the first through hole, and a third part connected to the second part and surrounding the first capacitor chip, and
a bottom surface of the third part is coplanar with the bottom surface of the first substrate.

2. The semiconductor package of claim 1, further comprising:
a second substrate on the first molding layer; and
a plurality of conductive structures that penetrate the first molding layer and connect the first substrate to the second substrate,
wherein, when viewed in plan, the first through hole is between the first semiconductor chip and the conductive structures.

3. The semiconductor package of claim 1, wherein a lateral surface of the second part of the first molding layer is vertically aligned with a lateral surface of the third part of the first molding layer.

4. The semiconductor package of claim 1, wherein the second part of the first molding layer is between the first part of the first molding layer and the third part of the first molding layer.

5. The semiconductor package of claim 1, wherein the second part of the first molding layer does not vertically overlap the first semiconductor chip.

6. The semiconductor package of claim 1, wherein
the first capacitor chip has a first surface facing the first semiconductor chip and a second surface opposite the first surface, and
the third part of the first molding layer is in contact with the first surface of the first capacitor chip and the second surface of the first capacitor chip.

7. The semiconductor package of claim 1, wherein a width of the first trench is in a range of about 300 μm to about 400 μm.

8. The semiconductor package of claim 1, wherein a ratio of a height of the first trench to a height of the first substrate is in a range of about 0.1 to about 0.5.

9. The semiconductor package of claim 1, wherein
the first capacitor chip includes a capacitor substrate, a first conductive layer on the capacitor substrate, a capacitor dielectric layer on the first conductive layer and having a plurality of through holes, and a capacitance structure filling the plurality of through holes, and
the capacitor substrate includes silicon.

10. The semiconductor package of claim 1, further comprising:
a second capacitor chip on the first substrate, wherein
the recessed portion of the bottom surface of the first substrate is a first recessed portion of the bottom surface of the first substrate,
the first substrate further includes a second trench in a second recessed portion of the bottom surface of the first substrate and a second through hole extending through the first substrate to the second trench, and
the second capacitor chip is in the second trench.

11. The semiconductor package of claim 10, wherein
the first molding layer extends toward the bottom surface of the first substrate and fills the second through hole and the second trench, and
when viewed in plan, the first through hole and the second through hole both do not overlap the first semiconductor chip.

12. A semiconductor package, comprising:
a first substrate including a first trench in a recessed portion of a bottom surface of the first substrate and a first through hole extending through the first substrate to the first trench;
a first semiconductor chip on the first substrate;
a first capacitor chip in the first trench, the first capacitor chip having a first surface facing a portion of the first semiconductor chip and a second surface opposite the first surface; and
a first molding layer on the first substrate and covering the first semiconductor chip, wherein
the first molding layer includes a first part extending parallel to a top surface of the first substrate and covering the first semiconductor chip, a second part connected to the first part and extending vertically in the first through hole, and a third part connected to the second part and in the first trench, and
the third part of the first molding layer covers the second surface of the first capacitor chip.

13. The semiconductor package of claim 12, wherein a bottom surface of the third part of the first molding layer is coplanar with the bottom surface of the first substrate.

14. The semiconductor package of claim 12, wherein a bottom surface of the third part of the first molding layer is located at a level between a level of the second surface of the first capacitor chip and a level of the bottom surface of the first substrate.

15. The semiconductor package of claim 12, wherein
at least a portion of the first capacitor chip vertically overlaps the first semiconductor chip, and
the second part of the first molding layer does not vertically overlap the first semiconductor chip.

16. The semiconductor package of claim 12, wherein a lateral surface of the second part of the first molding layer is coplanar with a lateral surface of the third part of the first molding layer.

17. The semiconductor package of claim 12, wherein a width of the first through hole is in a range of about 100 μm to about 300 μm.

18. The semiconductor package of claim 12, wherein
the first capacitor chip includes a capacitor substrate, a first conductive layer on the capacitor substrate, a capacitor dielectric layer on the first conductive layer and having a plurality of through holes, and a capacitance structure that fills the plurality of through holes, and
the capacitance structure includes titanium nitride.

19. A semiconductor package, comprising:
a first substrate including a first trench in a recessed portion of a bottom surface of the first substrate and a first through hole extending through the first substrate to the first trench;
a plurality of external coupling terminals on the bottom surface of the first substrate;
a first semiconductor chip on the first substrate and including a plurality of first chip pads;
a first capacitor chip in the first trench and on the first substrate;
a first molding layer on the first substrate and covering the first semiconductor chip;
a second substrate on a top surface of the first molding layer;
a third substrate on the second substrate and including a plurality of conductive pads;
a plurality of package connection terminals between the second substrate and the third substrate;
a second semiconductor chip on the third substrate and including a plurality of second chip pads; and
a plurality of bonding wires on the third substrate and connecting the plurality of conductive pads to the plurality of second chip pads, wherein
the first molding layer includes a first part extending parallel to a top surface of the first substrate, a second part connected to the first part and extending vertically in the first through hole, and a third part connected to the second part and surrounding the first capacitor chip, and
a bottom surface of the third part is coplanar with the bottom surface of the first substrate.

20. The semiconductor package of claim 19, further comprising:
a plurality of chip connection terminals on the first substrate; and
a plurality of conductive structures that penetrate the first molding layer, wherein the chip connection terminals are between the first substrate and the plurality of first chip pads of the first semiconductor chip.

\* \* \* \* \*